US010981783B2

(12) United States Patent
Gandelhman et al.

(10) Patent No.: US 10,981,783 B2
(45) Date of Patent: Apr. 20, 2021

(54) COMPONENT ESPECIALLY FOR HOROLOGY WITH SURFACE TOPOLOGY AND METHOD FOR MANUFACTURING THE SAME

(71) Applicant: Nivarox-FAR S.A., Le Locle (CH)

(72) Inventors: Alex Gandelhman, Neuchatel (CH); Pierre Cusin, Villars-Burquin (CH); Marco Verardo, Les Bois (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 16/441,068

(22) Filed: Jun. 14, 2019

(65) Prior Publication Data

US 2020/0048081 A1    Feb. 13, 2020

(30) Foreign Application Priority Data

Aug. 9, 2018  (EP) ..................... 18188355

(51) Int. Cl.
  *B81C 1/00*    (2006.01)
  *G04B 13/02*   (2006.01)
  (Continued)

(52) U.S. Cl.
  CPC ............ *B81C 1/00619* (2013.01); *B81B 5/00* (2013.01); *B81C 1/00031* (2013.01);
  (Continued)

(58) Field of Classification Search
  None
  See application file for complete search history.

(56) References Cited

U.S. PATENT DOCUMENTS

2010/0208555 A1* 8/2010 Hiraoka ................. G04B 15/14
                                                              368/131
2014/0291779 A1* 10/2014 Engelhardt ......... B81C 1/00531
                                                              257/415

(Continued)

FOREIGN PATENT DOCUMENTS

CH    702 431 A2    6/2011
CH    705 299 A2    1/2013
(Continued)

OTHER PUBLICATIONS

European Search Report dated Feb. 4, 2019 in European Application 18188355.4, filed on Aug. 9, 2018 (with English Translation of Categories of Cited Documents).

(Continued)

*Primary Examiner* — Jiong-Ping Lu
(74) *Attorney, Agent, or Firm* — Oblon, McClelland, Maier & Neustadt, L.L.P.

(57) ABSTRACT

A system including two components intended to be in friction contact with each other in a given direction, wherein the friction occurs in a functional area, wherein the system is at least one of the two components including, on a surface in the functional area, a texture formed of a series of troughs of rounded shape separated by peaks or a series of bumps of rounded shape separated by troughs, the troughs extending parallel in the given direction and allowing for the evacuation of debris produced by friction and serving as a reservoir for a lubricant. A method for manufacturing at least one component or a mold by the DRIE (deep reactive ion etching) process, wherein surface defects on the sidewalls machined by the DRIE process are used to form the troughs.

14 Claims, 2 Drawing Sheets

(51) Int. Cl.
*G04B 31/08* (2006.01)
*G04B 15/14* (2006.01)
*B81B 5/00* (2006.01)
*B81C 99/00* (2010.01)
*G04D 3/00* (2006.01)
*G04B 31/06* (2006.01)

(52) U.S. Cl.
CPC ...... *B81C 1/00103* (2013.01); *B81C 99/0075* (2013.01); *B81C 99/0085* (2013.01); *G04B 13/02* (2013.01); *G04B 13/022* (2013.01); *G04B 13/026* (2013.01); *G04B 13/027* (2013.01); *G04B 15/14* (2013.01); *G04B 31/06* (2013.01); *G04B 31/08* (2013.01); *G04D 3/0069* (2013.01); *B81B 2201/035* (2013.01); *B81C 2201/0132* (2013.01); *B81C 2201/115* (2013.01)

(56) References Cited

U.S. PATENT DOCUMENTS

2016/0376147 A1* 12/2016 Gandelhman .......... G04B 13/02
                                                                368/139
2016/0378064 A1    12/2016 Gandelhman
2017/0176942 A1     6/2017 Kohler et al.

FOREIGN PATENT DOCUMENTS

| CH | 710 846 A2 | 9/2016 | |
|----|------------|--------|---|
| EP | 3 002 637 A1 | 4/2016 | |
| EP | 3 109 199 A1 | 12/2016 | |
| EP | 3 109 200 A1 | 12/2016 | |
| EP | 3 181 939 A1 | 6/2017 | |
| JP | 2011-158050 A | 8/2011 | |
| JP | 2014-051741 A | 3/2014 | |
| JP | 2014051741 * | 3/2014 | ............... C25D 1/00 |
| JP | 2017-9609 A | 1/2017 | |

OTHER PUBLICATIONS

Korean Office Action dated Oct. 7, 2020 in Korean Patent Application No. 10-2019-0086518 (with English translation), 12 pages.
Japanese Office Action dated Oct. 6, 2020, issued in Japanese Patent Application No. 2019-124946 (with English translation).
Chinese Office Action dated Nov. 17, 2020, issued in Chinese Patent Application No. 201910730557.3 (with English translation).

* cited by examiner (a)

(b)

(c)

(d)

COMPONENT ESPECIALLY FOR HOROLOGY WITH SURFACE TOPOLOGY AND METHOD FOR MANUFACTURING THE SAME

CROSS-REFERENCE TO RELATED APPLICATION

This application claims priority to European Patent Application No. 18188355.4 filed on Aug. 9, 2018, the entire disclosure of which is hereby incorporated herein by reference.

FIELD OF THE INVENTION

The present invention relates to a micromechanical component, used, in particular, in the field of horology, intended to be subjected during use to friction contact with another component. It also relates to the method for manufacturing the component.

PRIOR ART

Numerous timepiece components, such as escapement components, jumpers, springs, etc., are subjected to friction during use. Conventionally, to be well made, such components must have a contact/friction surface that is perfectly smooth. However, friction between two bodies generally causes the formation of wear particles forming a third body. Far from having a proven positive effect, this third body may cause accelerated wear of the component with a detrimental effect on its function. To prevent such wear and reduce the friction forces that result in losses for certain functions, lubrication is applied to the surfaces of the components that come into friction contact. However, in the configuration where two perfectly smooth contact surfaces rub against each other, the lubricant gradually drains away from the contact/friction areas, resulting in medium and long term degradation of the friction contact conditions.

SUMMARY OF THE INVENTION

It is an object of the present invention to overcome the aforecited drawbacks by proposing a system with two components in friction contact wherein at least one component has a topology, in the area intended to be subjected to friction, which, on the one hand, facilitates the removal of particles produced by friction, and on the other, forms a reservoir for the lubricant.

To this end, the component has a scalloping structure in said area. This structure defines a set of troughs extending in the direction of friction and forming as many channels for the evacuation of debris generated by friction and for the flow of lubricant. The system of the invention is defined by claim 1.

According to the invention, the scalloping structure is created during the step of machining the component. The manufacturing method used is the DRIE process (deep reactive ion etching). This process causes the formation of scallops or undulations on the etched wall of the component. This scalloping is an inherent defect of the process that those skilled in the art, according to the state of the art, wish to eliminate. To this end, the DRIE process is generally followed by an oxidation and deoxidation step intended to smooth out the scalloped profile. By contrast, according to the invention, this step is at least partially obviated to maintain the scalloped profile which allows for the evacuation of wear debris and serves as lubricant reservoir.

The manufacturing method according to the invention thus makes it possible, in a single step, to machine the component and texture the surface. Further, the advantage of the method according to the invention is that the scalloped texturing is naturally aligned in the direction of friction on the etched wall. The method of the invention is defined by claim 12.

The invention also relates to a mould machined using the DRIE process to form a scalloped structure on the etched sidewalls of the mould. These moulds with the scalloped texture form a pattern for subsequent production of electroformed components. The electroformed components thus also have a texture of complementary shape to the scalloping, with troughs serving as debris evacuation channels and as lubricant reservoir in the area where friction occurs. The mould is defined in claim 9.

According to other advantageous variants of the invention:
- the troughs are longitudinal and parallel to each other.
- said troughs have a depth P which is greater than or equal to 100 nm and less than or equal to 500 nm, and preferably, less than or equal to 300 nm.
- the series of peaks and troughs or bumps and hollows form a periodic structure.
- the texture is present on one side of said at least one component machined by deep reactive ion etching.
- each of the two components includes said texture on a surface in the functional area, said troughs being disposed facing each other.
- only said at least one component has said texture on its surface, the other component of the system having a smooth surface in the functional area.
- said at least one component is made from silicon or metal.
- both components are timepiece components Other features and advantages of the present invention will appear in the following description of preferred embodiments, given by way of non-limiting example, with reference to the annexed drawings.

DETAILED DESCRIPTION

The present invention relates to components made from metal or from silicon comprising surfaces intended to be subjected to friction during use. The present invention thus relates more specifically to a system including two components having surfaces subjected to friction in a so-called 'functional' area. In the field of horology, this may be, for example, a system of the following type: escape wheel/pallets, cam/sensor, click/toothed wheel, jumper/disc, coupling disc/spring, brake disc/brake lever, etc. The present invention also relates to the moulds that make it possible to produce these components by electroforming. It also relates to the method for manufacturing the components or moulds.

As represented schematically in FIGS. 1A-2B, at least one of the two components 2 of system 1 has, in the functional area of its friction surface, a surface topology that, on the one hand, facilitates the evacuation of third-body particles and, on the other hand, forms a reservoir for the lubricant.

Figure 1A:
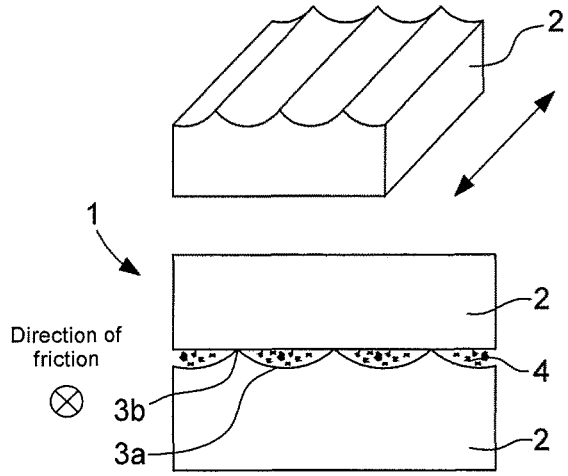
FIGS. 1A and 1B schematically represent a system with two components, wherein one of the two components, on the friction surface thereof intended to be partially in contact with the other component, has a texture in the form of a series of scallops parallel to each other according to the invention. Friction occurs along a longitudinal direction parallel to the longitudinal direction of the troughs receiving the third body (FIG. 1A) and the lubricant (FIG. 1B).
Figure 1B:
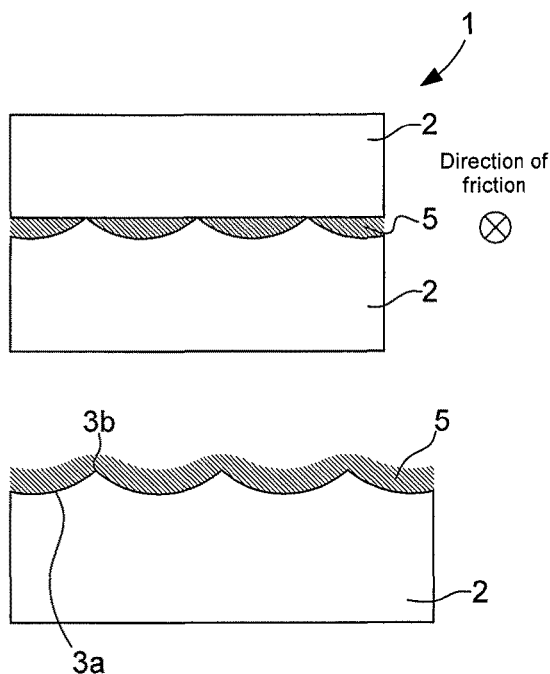

Referring to FIGS. 1A and 1B, the surface topology is formed of periodic scallops parallel to each other with troughs 3a, also called hollows, of rounded shape separated by peaks 3b. According to this variant, the contact between the two components 2 occurs on peaks 3b of the structure. The longitudinal dimension of troughs 3a extends parallel to the direction of friction in the functional area and the troughs serve as reservoirs for lubricant 5 and channels for evacuation of friction debris 4. According to the invention, depth P of the troughs which is the distance between the low point of the trough and the top of the peak is typically greater than or equal to 100 nm and less than or equal to 500 nm (FIG. 3B).

Figure 2A:
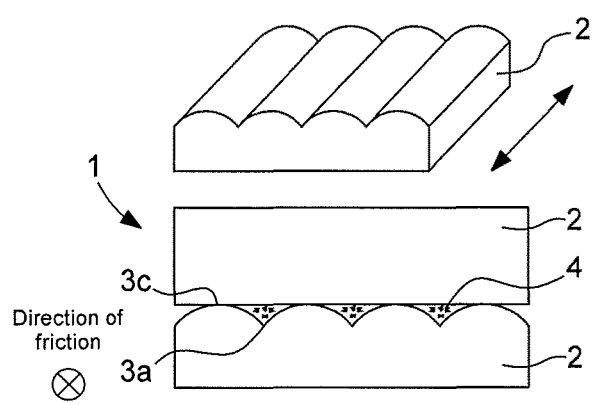
FIGS. 2A and 2B represent a variant of the system with two components wherein one of the two components has a texture of complementary shape to that represented in FIGS. 1A and 1B.
Figure 2B:
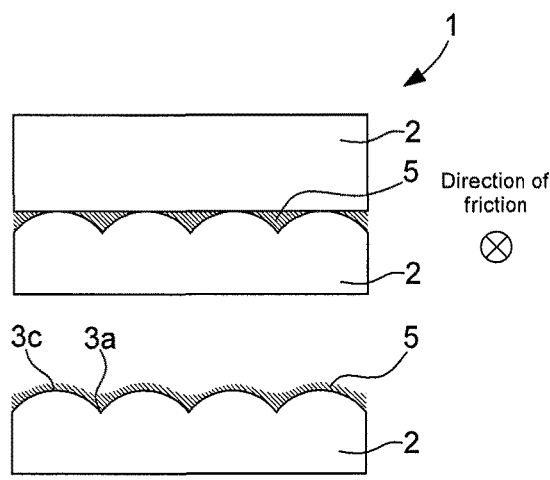

In FIGS. 2A and 2B, the structure has a series of rounded bumps 3c separated by troughs 3a. This structure is obtained by electroforming metal components in moulds having the scalloped structure of FIGS. 1A and 1B. Depth P of the hollows thus corresponds here to the distance between the low point of the trough and the top of the bump and is of course equal to the aforementioned depth P. According to this other variant, the contact between the two components 2 occurs at the top of bumps 3c of the texture.

In the variants presented in FIGS. 1A-2B, only one of the two components includes troughs, the other component having a substantially smooth friction surface in the functional area. According to another variant that is not represented, the two components can have troughs in this area which face each other and together form debris evacuation channels and lubricant reservoirs.

Figure 3A:
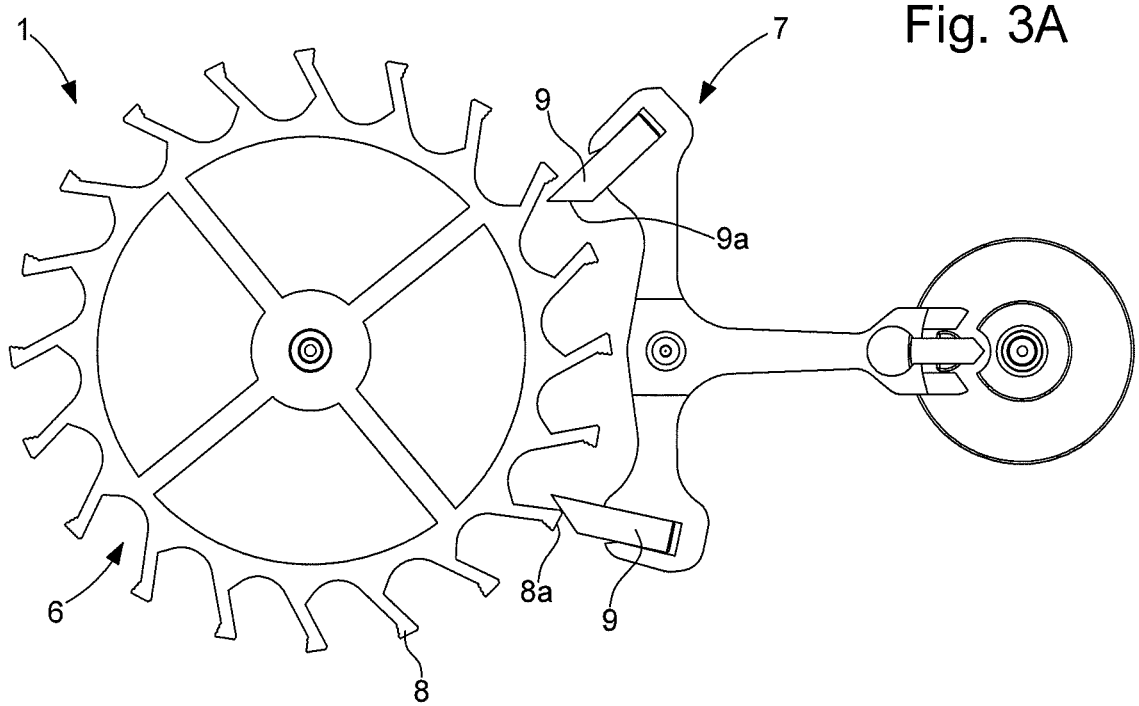
FIG. 3A is a representation of a timepiece system comprising two components (escapement wheel/pallet lever) which, on the edge of the teeth and/or of the pallets, have a texture according to the invention.
Figure 3B:
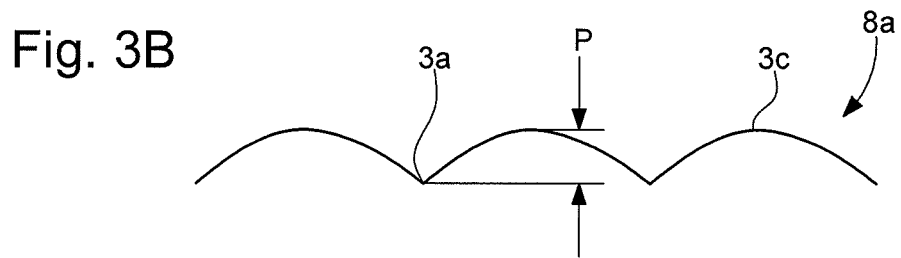
FIG. 3B schematically represents the texture on the etched wall.

By way of illustration, FIG. 3A represents a timepiece system 1: escape wheel 6/pallet lever 7 wherein one or both components 6, 7 have, at least on the sidewall 8a, 9a of teeth 8 and/or pallets 9 that is subjected to friction, a texture according to the invention (FIG. 36).

Figure 4:
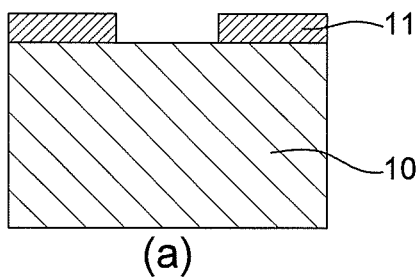
FIG. 4 schematically illustrates, in a known manner, the various steps of the DRIE deep reactive ion etching process.
Figure 4:
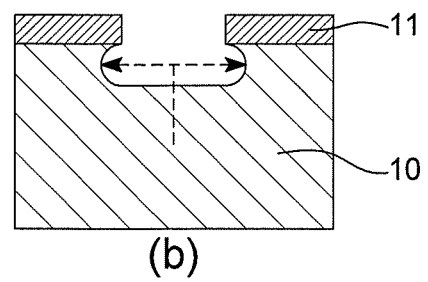
Figure 4:
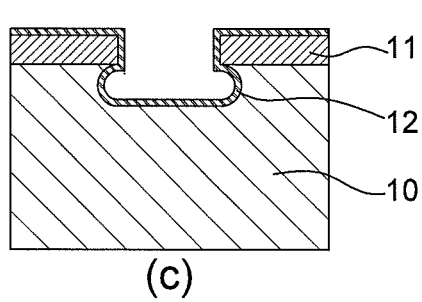
Figure 4:
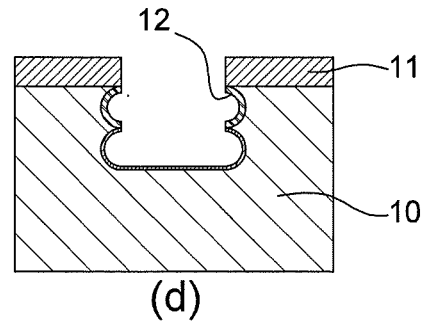

This surface texture is obtained during machining of the component or of the mould by the DRIE process which is a plasma etching process that includes two different cycles that succeed one another, namely an etching cycle and a passivation cycle. The method is schematically represented in FIG. 4. In a known manner, a silicon blank 10 is provided. A perforated mask 11 defining the trench to be machined is formed on the surface of blank 10 (FIG. 4a). The method then consists in the series of steps of etching (FIG. 4b) in fluorinated gas (e.g. $SF_6$) and of passivation (layer 12) using fluorocarbon gas (e.g. $C_4F_8$), wherein the alternate etching and passivation steps produce the scalloped structure on the etched sidewall. The periodicity and depth of the troughs can, in a known manner, be adjusted by changing, amongst other things, the etching and passivation sequence times. (for example, 6 of etching—2 of passivation, or 3 of etching—1 of passivation). Preferably, the etching phase durations are greater than the passivation phase durations.

Typically, these troughs have a depth P comprised between 100 and 1000 nm and preferably on the order of a few hundred nanometres with a trough periodicity comprised between 1.5 and 6 μm and preferably on the order of 3 μm.

Optionally, to reduce the depth of the troughs, without thereby removing surface roughness, an oxidation step followed by a deoxidation step can be envisaged (not represented). This step consists in performing thermal oxidation at temperatures typically comprised between 900 and 1200° C. followed by chemical deoxidation typically in hydrofluoric acid. By way of example, trough depth P can thus be reduced from 300 nm to 100-200 nm during this step.

Then, when the aforementioned method is used to manufacture a mould, the method further includes a deposition step by electroforming a metal alloy on the textured surface of the mould to produce the component with a series of bumps and troughs on its surface.

LEGEND (1) System of components
(2) Component
(3) Scalloped structure
   a) Trough or hollow
   b) Peak
   c) Bump
(4) Debris
(5) Lubricant
(6) Escape wheel
(7) Pallet-lever
(8) Escape wheel tooth
   a. Edge or sidewall
(9) Pallets
   a. Edge or sidewall
(10) Blank
(11) Mask
(12) Passivation layer

The invention claimed is:

1. A system comprising two components intended to be in friction contact with each other via friction surfaces in a given direction of friction, wherein the friction occurs in a functional area, the system comprising
a first component comprising, in the functional area, a first surface having a texture formed of a series of troughs of rounded shape separated by peaks, said troughs extending parallel to said given direction; and
a second component comprising, in the functional area, a smooth second surface,
wherein the first and second surfaces, when in friction contact, are configured to form a region configured to allow for the evacuation of debris produced by friction and to serve as a reservoir for a lubricant.

2. The system according to claim 1, wherein said troughs are longitudinal and parallel to each other.

3. The system according to claim 2, wherein said troughs have a depth P which is greater than or equal to 100 nm and less than or equal to 1000 nm.

4. The system according to claim 1, wherein said troughs have a depth P which is greater than or equal to 100 nm and less than or equal to 1000 nm.

5. The system according to claim 1, wherein said series of troughs and peaks forms a periodic structure.

6. The system according to claim 1, wherein said texture is present on one sidewall of said at least one component machined by deep reactive ion etching.

7. The system according to claim 1, wherein only said at least one component comprises said texture on its surface, the other component of the system having a smooth surface in the functional area.

8. The system according to claim 1, wherein said at least one component is made from silicon or from metal.

9. The system according to claim 1, wherein both components are timepiece components.

10. The system according to claim 1, wherein said troughs have a depth P which is greater than or equal to 100 nm and less than or equal to 300 nm.

11. The system according to claim 1, comprising the lubricant being disposed in said troughs.

12. The system according to claim 1, wherein said first and second components comprise a pallet lever and escape wheel.

13. A system, comprising two components intended to be in friction contact with each other via friction surfaces in a given direction of friction, wherein the friction occurs in a functional area, the system comprising
a first component comprising, in the functional area, a first surface having a texture formed of a series of first troughs of rounded shape separated by peaks, said troughs extending parallel to said given direction; and
a second component comprising, in the functional area, a second surface comprising a series of second troughs of rounded shape separated by peaks, said troughs extending parallel to said given direction,
wherein said texture said first and second troughs are disposed facing each other, and
wherein the first and second surfaces, when in friction contact, are configured to form a region configured to allow for the evacuation of debris produced by friction and to serve as a reservoir for a lubricant.

14. A timepiece comprising the system including two components intended to be in friction contact with each other via friction surfaces in a given direction of friction, wherein the friction occurs in a functional area, the system comprising at least one of the two components comprising, in the functional area, a surface having a texture formed of a series of troughs of rounded shape separated by peaks said troughs extending parallel to said given direction and configured to evacuate debris produced by friction and serving as a reservoir for a lubricant.

* * * * *